United States Patent [19]
Glance et al.

[11] Patent Number: 5,907,569
[45] Date of Patent: May 25, 1999

[54] CIRCUIT FOR CONTROLLING THE OUTPUT POWER OF AN UNCOOLED LASER OR LIGHT EMITTING DIODE

[75] Inventors: Bernard Glance, Colts Neck Township; Kang-Yih Liou, Holmdel Township, both of N.J.

[73] Assignee: Lucent Technologies Inc., Murray Hill, N.J.

[21] Appl. No.: 08/864,323

[22] Filed: May 28, 1997

[51] Int. Cl.[6] ............................................. H01S 3/00
[52] U.S. Cl. .......................... 372/38; 372/34; 372/33; 372/43; 372/29
[58] Field of Search ............................. 372/9, 26, 33, 372/34, 38, 43, 50, 29

[56] References Cited

U.S. PATENT DOCUMENTS

| | | | |
|---|---|---|---|
| 3,705,316 | 12/1972 | Burrous et al. | 307/311 |
| 4,639,924 | 1/1987 | Tsunekawa | 372/33 |
| 5,197,076 | 3/1993 | Davis et al. | 372/34 |

*Primary Examiner*—Brian Heely

[57] ABSTRACT

A selected positive coefficient resistor is connected in parallel across a laser, Light Emitting Diode (LED) or amplifier LED (ALED) to adjust the bias current, respectively, to the laser, LED or ALED as a function of temperature so as to maintain a more regulated optical power output therefrom.

16 Claims, 4 Drawing Sheets

CIRCUIT FOR CONTROLLING THE OUTPUT POWER OF AN UNCOOLED LASER OR LIGHT EMITTING DIODE

TECHNICAL FIELD OF THE INVENTION

This invention relates to Lasers and Light Emitting Diodes (LEDs) and, more particularly, to a circuit for controlling the output power of an uncooled laser or light emitting diode.

BACKGROUND OF THE INVENTION

Light Emitting Diodes (LEDs) and Amplified LEDs (ALEDs) have recently become very important for use as transceivers in local access systems. Illustrative applications of the use of LEDs and LEDs in transceivers is described in our recently filed U.S. patent application C. R. Doerr, K -Y Liou and B. Glance, case 11 - 46 - 12, Ser. No. 08/857,347, filed on May 16, 1997 and entitled FULL-DUPLEX WAVELENGTH DIVISION MULTIPLEXING SYSTEM USING SINGLE-DEVICE TRANSCEIVERS, pending. That application describes the use of LEDs and ALEDs as transceivers at both the Central Office (CO) and Remote Node (RN) locations of a single-fiber full-duplex WDM system. In such typical applications, the temperature at the CO location is usually controlled while the temperature at the RN location is uncontrolled and can vary drastically. As a result, at the RN location the optical power from an LED/ALED varies substantially with temperature changes which, undesirably, may cause LED/ALED laser operation (at low temperatures) or reduced signal to noise levels (at higher temperatures). Consequently, a problem exists at the RN location to maintain a nearly constant optical output from an LED/ALED transceiver over the expected temperature range.

In the prior art, a circuit for the regulation of the power output of a laser or LED transmitter typically uses a photodiode to monitor power levels. The detected optical power level from the photodiode is then used by a feedback control circuit to regulate the power level of the laser or LED. Undesirably, such active power regulators are complex and expensive.

SUMMARY OF THE INVENTION

In accordance with the present invention, a circuit is proposed to maintain a more regulated optical power output from a laser or LED transceiver by adjusting the bias current, respectively, to the laser or LED transceiver as a function of temperature. More particularly, a laser or LED circuit comprises a laser or LED having a first and a second terminals across which is connected a compensation circuit having a positive coefficient of resistance for adjusting, respectively, a bias current provided to the laser or LED. The positive coefficient of the compensation circuit is selected to minimize the variation in light outputted from the laser or LED with temperature.

In another embodiment, the LED may be an Amplifier LED (ALED) which includes an amplifier integrated therewith to amplify light signals produced by the LED. In another embodiment, when the amplifier and LED of the ALED have separate terminals, the compensation circuit may include a resistor connected in series with both the amplifier and LED to allocate bias currents to the amplifier and LED.

DETAILED DESCRIPTION

Figure 1:
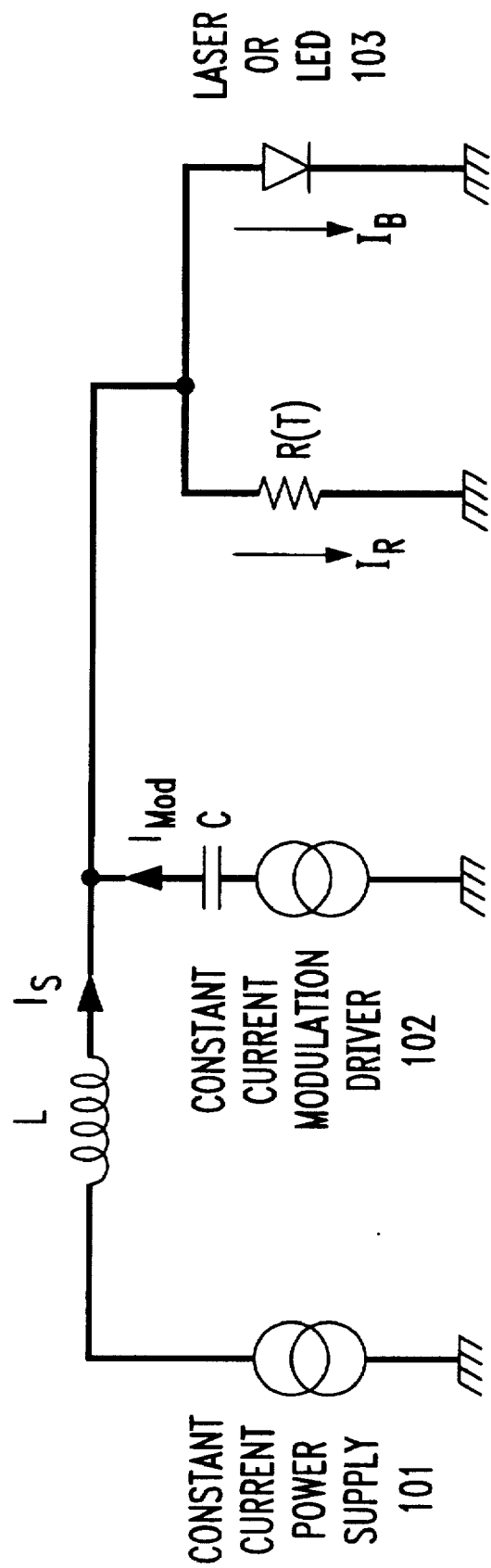
FIG. 1 shows a schematic diagram of out temperature compensated bias circuit for use with a laser or LED.

FIG. 1 shows a diagram of our temperature compensated bias circuit for providing a simple and low-cost method allowing to operate an uncooled laser or Light Emitting Diode (LED) at nearly constant output power over a temperature range from −40° C. to +85° C. The following description of our temperature compensated bias circuit is initially described for use with an LED. Although not illustrated, the bias circuit of FIG. 1 can also be used for an Amplified Light Emitting Diode (ALED) (which is a device which includes an optical amplifier for amplifying the optical output from the LED). Thus, in the following description of FIG. 1, what is described for use with an LED may also be used when an ALED is substituted for the LED. However, the bias circuit arrangement shown in FIG. 3 may be preferred for use with an ALED.

An illustrative system in which the present invention may be used is described in our article authored by B. Glance et al, entitled "A Single-Fiber WDM Local Access Network Based on Amplified LED Transceivers", published in IEEE Photonics Technology Letters, Vol. 8, No. 9, dated September, 1996, pp 1241–1242, which is incorporated by reference herein. That article describes the use of LEDs and ALEDs as transceivers at both the Central Office (CO) and Remote Node (RN) locations of a single-fiber full-duplex WDM system.

Figure 2:
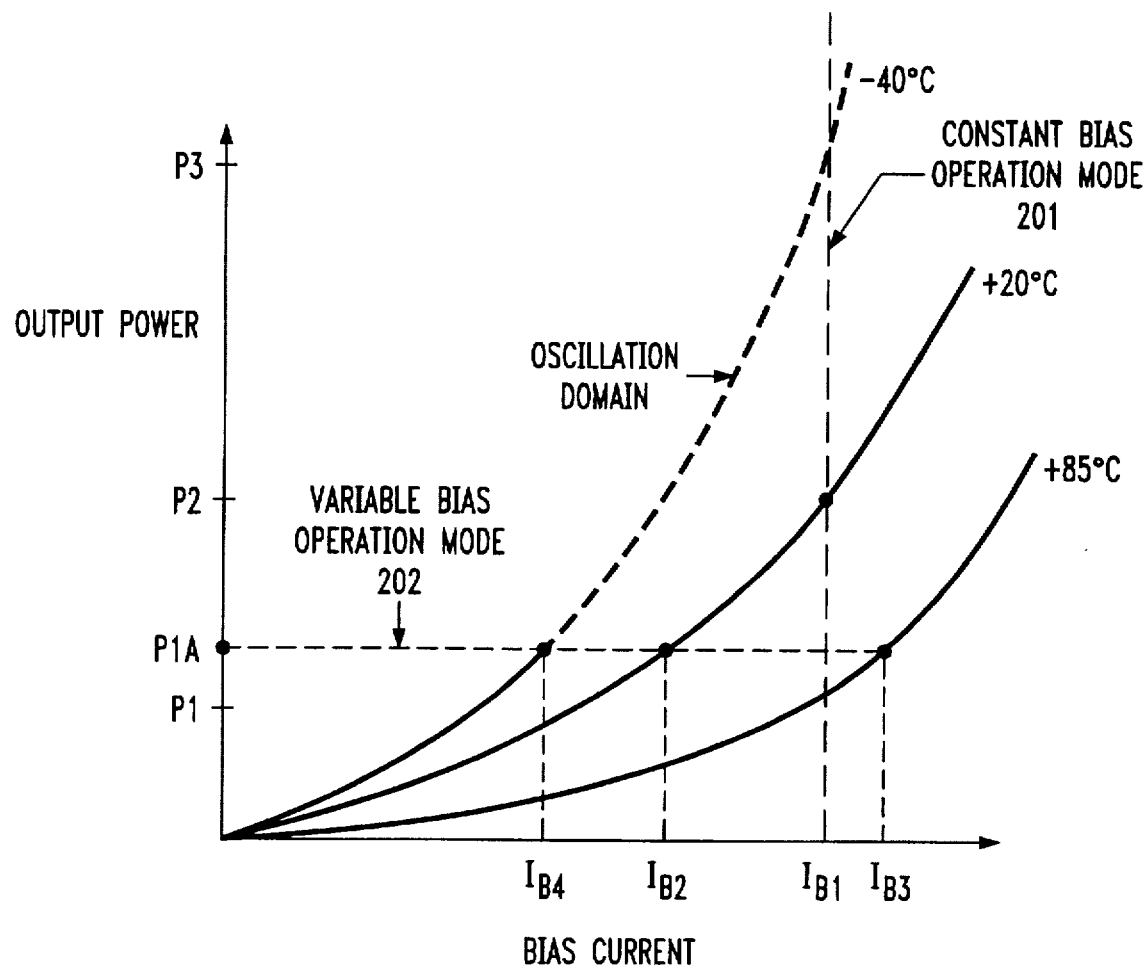
FIG. 2 shows an illustrative plot of the variation in output power of an LED with bias current and temperature.

In typical applications, the temperature at the CO location is usually controlled while the temperature at the RN location is uncontrolled and can vary drastically. The LEDs or ALEDs of the Optical Network Units (ONUs) at the RN of the WDM system must be able to operate at temperatures varying, illustratively, from −40° C. to 85° C. With reference to FIG. 2, under such conditions the optical output power of an LED/ALED decreases with increasing temperature by about 3 dB when the temperature reaches 85° C., relative to the optical power obtained at 20° C. Consequently, the LED/ALED may start to oscillate when the temperature drops to the lowest temperature values. At increasing temperatures, the optical output power of the LED/ALED falls off substantially, which results in a reduced signal-to-noise (S/N) level for the system, especially at higher temperatures, e.g., at 85° C. Maintaining a nearly constant output from the LED or ALED transmitter of an optical system is necessary because it relaxes or reduces the dynamic signal operating range requirements at the system receiver.

To overcome this problem, we propose adding a single element passive circuit element, resistor R(T), to the bias circuit arrangement of FIG. 1 to suppress oscillation and maintain a nearly constant optical output power from the LED/ALED over the full temperature range. As shown the resistor R(T) is added in parallel with the LED (or ALED). The resistor R(T) is selected to have a positive coefficient of resistance, so that its resistance increases appropriately with temperature.

As shown in FIG. 1, the conventional LED bias circuit includes a bias current supply for supplying the current $I_S=I_B$ to LED 103. Typically, for improved system performance this bias current supply should be a constant current power supply 101, as shown. The inductor L prevents the modulation current $I_{Mod}$ from affecting the constant current power supply 101. The modulation current $I_{Mod}$ from the constant current Modulation driver 102 is a data signal used to modulate the optical carrier signal of LED 103. The capacitor C blocks the bias current $I_B$ from the Modulation driver 102.

With reference to FIG. 2, when a constant bias current, e.g., $I_{B1}$, is used, the optical power from LED 103 can vary from a low power level P1 at 85° C., to a typical operating level of P2 at about room temperature 20° C., up to an oscillating (laser) power level P3 at −40° C. Typically such a wide variation in optical output power with temperature results in drastic changes in receiver and hence system performance with temperature. Additionally, since the modulation current ($I_{Mod}$) modulates the bias current $I_{B1}$, the resulting power level modulation at the temperatures −40° C., 20° C. and 85° C. is also widely varying. This causes further variation in receiver and system performance with temperature.

In accordance with the present invention, using the temperature dependence of the output power versus temperature characteristic shown in FIG. 2, a positive temperature coefficient resistor R(T) is determined which adjusts the current to the Led to maintain a constant power form the LED. The resistor R(T) is then placed in parallel across the terminals of the LED 103 and results in a nearly constant optical output power from the LED (or ALED) over the illustrative temperature range −40° C. to 85° C. As a result, the LED (or LED) can be made to operate within the dynamic power output range requirement specified for a system over the desired operating temperature range.

Since the resistor R(T) will draw a current $I_R$, the current $I_S$ from constant current power supply 101 should be such that it is equal to $I_R$ plus $I_B$ over the complete temperature range −40° C. to 85° C. With reference to the "Variable Bias Operating Mode" curve shown in FIG. 2 and assuming that the desired operating bias current for LED is $I_{B2}$ at temperature 20° C., the positive temperature coefficient of resistor R(T) is selected so that the power level P1A remains essentially constant as the temperature varies from 20° C. to −40° C. or from 20° C. to 85° C. To accomplish this, the resistance of resistor R(T) must increase at high temperatures so that its current $I_R$ can decrease by the amount $I_{B3}-I_{B2}$, thereby providing the additional current needed so that the LED 1013 bias current can increase to $I_{B3}$, the desired operating current at 85° C. Similarly, the resistance of resistor R(T) must decrease at low temperatures so that its current $I_R$ can increase by the amount $I_{B2}-I_{B4}$, thereby accepting the excess current from the LED 103 bias current, so that the LED 103 bias current can drop to $I_{B4}$, the desired operating current at −40° C. The resistor R(T) may be a well known thermistor, varistor, or other similar positive temperature coefficient resistor device.

As a result, the constant biasing current $I_S$ supplied to the circuit is divided between the LED 103 and the parallel resistance R(T) with a ratio which varies with the temperature. When an ALED is used instead of an LED in FIG. 1, the ratio is selected to yield nearly constant ALED output power and also to eliminate the undesirable possibility of oscillation at low temperatures, which existed in prior art bias circuits.

Note that the same arrangement maintains the maximum extinction ratio for the modulation if the modulation signal $I_{Mod}$ is provided by a constant peak current supply.

Figure 3:
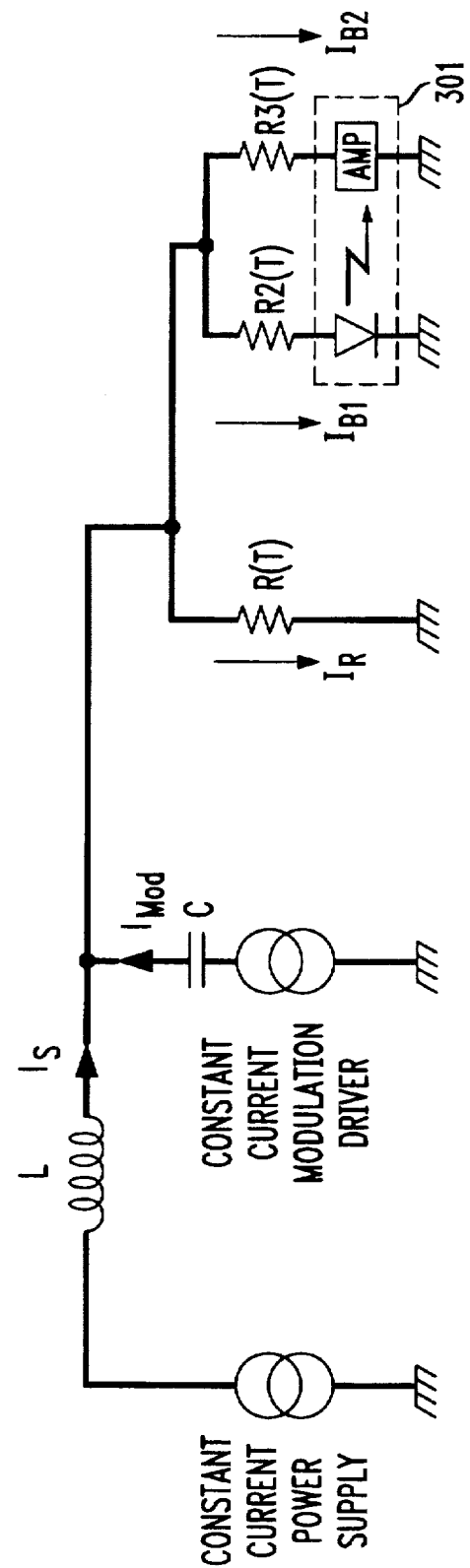
FIG. 3 shows an implementation of our temperature compensated ALED bias circuit.

Shown in FIG. 3 is a preferred arrangement for controlling the output power of an uncooled ALED. The ALED provides a higher output power than an LED and it has two separate sections each with a separate electrical contact, one contact connects to the optical amplifier section and the other contact connects to the LED section. The two sections are monolithically integrated.

Additional temperature dependent resistors R2(T) and R3(T) are connected in series, respectively, with the LED section and the amplifier section. The temperature coefficients of resistors R2(T) and R3(T) are selected so that the respective bias currents $I_{B1}$ and $I_{B2}$ through the Led and amplifier sections, respectively, can be divided in a controlled manner to insure that ALED 301 can be operated over the specified temperature range (−40 to 85° C.) to both maintain a nearly constant output and suppress oscillation.

As previously discussed, a predetermined positive temperature coefficient resistor R(T) is placed in parallel across the series combination of ALED 301 and resistors R2(T) and R3(T). The constant biasing current $I_S$ supplied to the circuit is thus divided between the three resistor branches with a variable ratio depending on the temperature.

The temperature coefficient and values of resistors R(T), R2(T) and R3(T) are jointly selected to insure a nearly constant optical output power from the ALED 301 over the full temperature range −40° C. to 85° C. More particularly, the value and temperature coefficient of resistor R3(T) is selected, in conjunction with resistors R(T) and R2(T), to suppress ALED 301 lasing at low temperatures by properly controlling the optical gain of the amplifier section of the ALED 301. The resistors R2(T) and R3(T) are first selected to apportion the current $I_S$ between the amplifier and the LED. The resistor R(T) is then selected relative to the combined resistance of the amplifier and LED paths. To accomplish the desired compensation, generally, the positive coefficient of R(T) will need to be greater than that of R2(T) and R3(T). In this manner, the compensation circuit resistors R(T), R2(T) and R3(T) are used to reduce the amplifier current at low temperature to suppress lasing and used to increase the amplifier current at high temperature to maintain a high output power.

In the same manner as previously described in FIG. 1, the resistors R(T), R2(T) and R3(T) of the compensation circuit also adjusts the modulation current $I_{MOD}$ to a value yielding the maximum extinction ratio if the modulation driver 102 also supplies a constant peak current value.

With reference to FIG. 1 again, when a laser is sued as the optical signal source 103 of a communication system, it must also be able to operate over a wide range of temperatures. As previously described, prior art techniques for regulating the optical output power of lasers has involved the use of photodiode (either self-contained with the laser or external to the laser) as part of a output power control circuit. While such arrangements have worked well, they are complicated and expensive to implement in comparison to our passive output power control circuit shown in FIG. 1.

Figure 4:
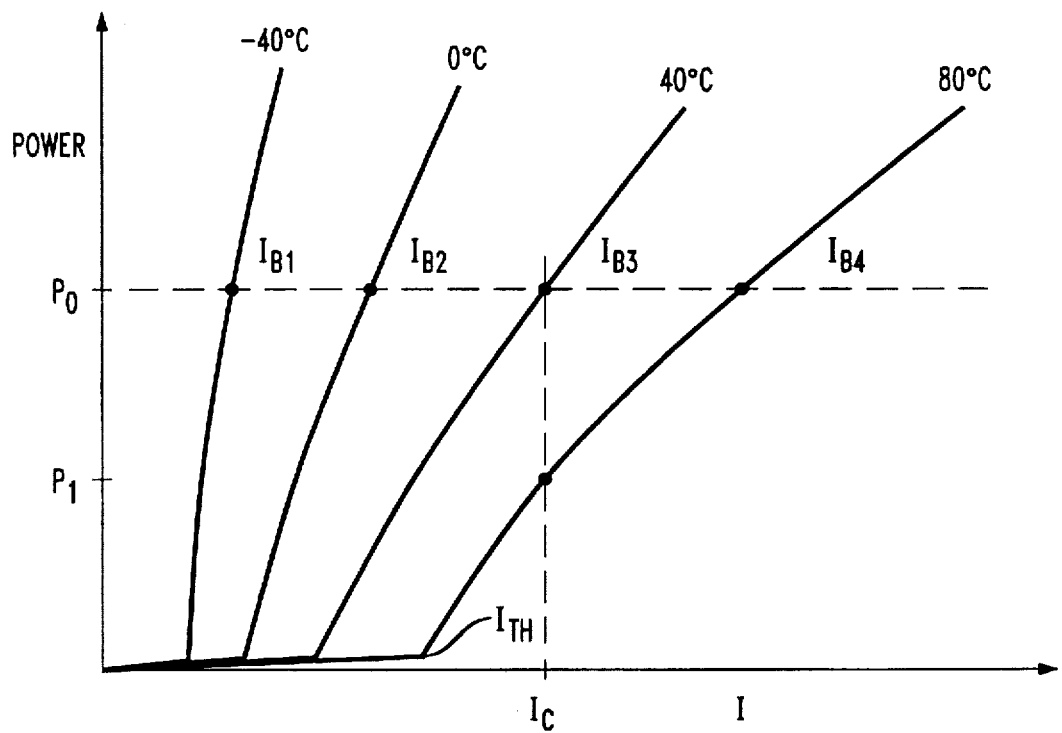
FIG. 4 shows an illustrative plot of the variation in output power of a laser with bias current and temperature.

Shown in FIG. 4 is an illustrative plot of the variation in output optical power of a laser with bias current and temperature. As shown, both the threshold current $I_{TH}$ and the bias current (e.g., $I_{B1}$, $I_{B2}$, $I_{B3}$, and $I_{B4}$) required to provide a predetermined optical output power $P_0$ increases substantially with temperature. Thus, if a laser is located in an unregulated temperature environment and the bias current remains constant, substantial variations in laser output power $P_0$ will occur with changes in environment temperatures. For example, as shown, if a laser is biased at a constant bias current $I_C$ at an environment temperature of 40° C., and the temperature increases to 80° C., the resulting laser power will drop to $P_1$. In fact, depending on the laser bias current level, there may be an increased temperature at which the lasing action ceases in the laser.

Figure 5:
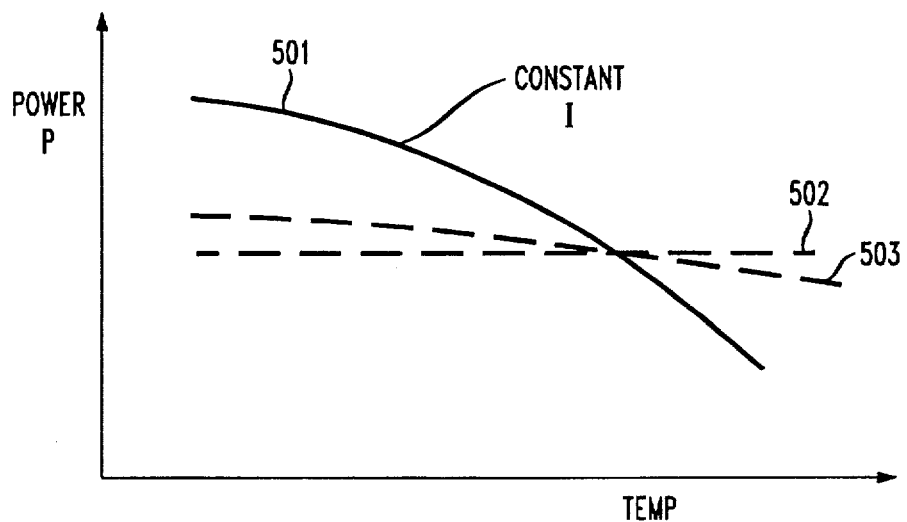
FIG. 5 shows an illustrative plot of the variation in output power with temperature of a laser operating at a constant bias current, without compensation and using our compensation technique.

With reference to FIG. 5, there is shown an illustrative plot 501 of the variation in laser output power P with temperature for a laser operating at a constant bias current I. As shown by 501, for a given bias current, the output power from an uncompensated laser decreases drastically with increases in temperature. Using out bias current compensation technique with an appropriately selected positive coefficient resistor R(T), selected using the same technique previously described for compensating LEDs, the laser output power P can be regulated or controlled within predetermined limits, as shown by curves 502 and 503.

While not shown in FIG. 1, better compensation for a laser or LED/ALED may be obtained by inserting a positive (or negative) coefficient resistor in series with the laser. The temperature coefficient of resistance of the inserted resistor would typically be smaller than the positive coefficient of resistance of resistor R(T).

Our laser and LED/ALED bias compensation circuits of FIGS. 1 and 2 are less complicated and cheaper than prior art techniques while providing comparable performance.

What has been described is merely illustrative of the application of the principles of the present invention. Other arrangements and methods can be implemented by those skilled in the art without departing form the spirit and scope of the present invention.

We claim:

1. A Light Emitting Diode (LED) circuit comprising an LED having a first and a second terminals and a compensation circuit having a positive coefficient of resistance and having a first and second terminals connected, respectively, in parallel across the first and second terminals of the LED, the compensation circuit increasing a bias current provided to the LED as a function of temperature by decreasing the bias current it draws as a function of temperature.

2. The LED circuit of claim 1 wherein the positive coefficient of the compensation circuit is selected to minimize the variation in light outputted from the LED with temperature.

3. The LED circuit of claim 1 further comprising bias current means for providing a bias current $I_S$ to the LED and compensation circuit.

4. The LED circuit of claim 3 wherein the bias current means is a constant current source.

5. The LED circuit of claim 1 further comprising means for providing a modulating current to the first terminal of the LED.

6. The LED circuit of claim 1 wherein the LED is an Amplifier LED(ALED) which includes an amplifier integrated therewith to amplify light signals produced by the LED.

7. The ALED circuit of claim 6 wherein the compensation circuit includes a resistor R(T) having a positive coefficient selected to minimize the variation in light outputted from the ALED with temperature.

8. The ALED circuit of claim 7 wherein the amplifier and LED have separate first terminals and wherein the compensation circuit further includes a resistor R3(T) connected in series with the amplifier and a resistor R2(T) connected in series with the LED, the resistors R2(T) and R3(T) also connected to the first terminal of the compensation circuit.

9. The ALED circuit of claim 8 wherein each of the resistors R2(T) and R3(T) in series with the LED and amplifier have a positive coefficient of resistance.

10. The ALED circuit of claim 8 wherein the coefficient of resistance of resistors R2(T) and R3(T) are less than the positive coefficient of resistance of resistor R(T).

11. The ALED circuit of claim 8 wherein the coefficient of each of the resistors R2(T) and R3(T) in series with the LED and amplifier is selected together with the positive coefficient of resistor R(T) so as to minimize the variation in light outputted from the ALED with temperature.

12. A laser circuit comprising a laser having a first and a second terminals and a compensation circuit having a positive coefficient of resistance and having a first and second terminals connected, respectively, in parallel across the first and second terminals of the laser, the compensation circuit increasing a bias current provided to the laser as a function of temperature by decreasing the bias current it draws as a function of temperature.

13. The laser circuit of claim 12 wherein the compensation circuit includes a positive coefficient resistor R(T) selected to minimize the variation in light outputted from the laser with temperature.

14. The laser circuit of claim 12 further comprising constant current means for providing a bias current $I_S$ to the LED and compensation circuit.

15. The laser circuit of claim 12 further comprising means for providing a modulating current to the first terminal of the laser.

16. The laser circuit of claim 13 wherein the compensation circuit further includes a resistor connected in series with the laser so that the resulting series combination of the resistor and the laser is in parallel with the resistor R(T).

* * * * *